United States Patent
Kim et al.

(10) Patent No.: US 9,761,476 B2
(45) Date of Patent: Sep. 12, 2017

(54) DICING FILM AND DICING DIE-BONDING FILM

(71) Applicant: LG CHEM, LTD., Seoul (KR)

(72) Inventors: Se Ra Kim, Daejeon (KR); Jung Ho Jo, Daejeon (KR); Young Kook Kim, Daejeon (KR); Hee Jung Kim, Daejeon (KR); Kwang Joo Lee, Daejeon (KR); Jung Hak Kim, Daejeon (KR); Seung Hee Nam, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/781,537

(22) PCT Filed: Dec. 29, 2014

(86) PCT No.: PCT/KR2014/012981
§ 371 (c)(1),
(2) Date: Sep. 30, 2015

(87) PCT Pub. No.: WO2015/102342
PCT Pub. Date: Jul. 9, 2015

(65) Prior Publication Data
US 2016/0060489 A1 Mar. 3, 2016

(30) Foreign Application Priority Data

Jan. 3, 2014 (KR) .................. 10-2014-0000912
Dec. 26, 2014 (KR) .................. 10-2014-0190448

(51) Int. Cl.
*H01L 21/00* (2006.01)
*H01L 21/683* (2006.01)
*C09J 133/04* (2006.01)
*C09J 7/02* (2006.01)
*H01L 23/00* (2006.01)
*C09D 133/04* (2006.01)

(52) U.S. Cl.
CPC ........ *H01L 21/6836* (2013.01); *C09D 133/04* (2013.01); *C09J 7/0296* (2013.01); *C09J 133/04* (2013.01); *H01L 24/27* (2013.01); *H01L 24/29* (2013.01); *C09J 2203/326* (2013.01); *C09J 2400/22* (2013.01); *C09J 2433/006* (2013.01); *C09J 2463/00* (2013.01); *H01L 24/32* (2013.01); *H01L 24/94* (2013.01); *H01L 2221/68327* (2013.01); *H01L 2221/68381* (2013.01); *H01L 2224/271* (2013.01); *H01L 2224/27003* (2013.01); *H01L 2224/2919* (2013.01); *H01L 2224/32245* (2013.01); *H01L 2224/83885* (2013.01); *H01L 2224/92* (2013.01); *H01L 2224/94* (2013.01)

(58) Field of Classification Search
CPC ......... H01L 21/6836; H01L 2224/8085; H01L 2224/8185; H01L 2224/8285
USPC ....................................... 438/465
See application file for complete search history.

(56) References Cited

U.S. PATENT DOCUMENTS

| | | |
|---|---|---|
| 2006/0204749 A1 | 9/2006 | Kita et al. |
| 2008/0145668 A1* | 6/2008 | Jung .................. C09D 167/02 428/413 |
| 2010/0019365 A1 | 1/2010 | Matsumura et al. |
| 2010/0029061 A1* | 2/2010 | Kamiya ............... C08F 220/18 438/464 |
| 2011/0111218 A1 | 5/2011 | Yoo et al. |
| 2012/0171844 A1 | 7/2012 | Hwang et al. |
| 2013/0003389 A1* | 1/2013 | Moroishi ............. C08F 265/06 362/311.01 |

FOREIGN PATENT DOCUMENTS

| | | |
|---|---|---|
| CN | 1906737 A | 1/2007 |
| CN | 101506948 A | 8/2009 |
| CN | 101675137 A | 3/2010 |
| CN | 102015953 A | 4/2011 |
| CN | 102533147 A | 7/2012 |
| JP | 2011-184603 A | 9/2011 |
| JP | 2013-038098 A | 2/2013 |
| JP | 2013-157470 A | 8/2013 |
| JP | 2013-197390 A | 9/2013 |
| KR | 10-2006-0126364 A | 12/2006 |
| KR | 10-2009-0111263 A | 10/2009 |
| KR | 10-2010-0054782 A | 5/2010 |
| KR | 10-2012-0076270 A | 7/2010 |
| KR | 10-2011-0101102 A | 9/2011 |
| KR | 10-1178712 B1 | 8/2012 |
| TW | 201137076 A | 1/2012 |
| TW | 201300492 A | 1/2013 |
| WO | 2008-133472 A1 | 11/2008 |
| WO | 2009-131405 A2 | 10/2009 |
| WO | 2012-121547 A2 | 9/2012 |
| WO | 2012-173325 A1 | 12/2012 |

OTHER PUBLICATIONS

International Search Report issued in corresponding International application No. PCT/KR2014/012981, dated Feb. 26, 2015, 5 pages.

* cited by examiner

*Primary Examiner* — Brook Kebede
(74) *Attorney, Agent, or Firm* — Rothwell, Figg, Ernst & Manbeck, P.C.

(57) ABSTRACT

The present invention relates to a dicing film including: a substrate film; and a cohesive layer, wherein a storage modulus of the cohesive layer at 30° C. is 3*10$^5$ to 4*10$^6$ Pa, and the cohesive layer has a degree of cross-linking of 80% to 99%, a dicing die-bonding film including the dicing film, and a dicing method of a semiconductor wafer using the dicing die-bonding film.

15 Claims, No Drawings

DICING FILM AND DICING DIE-BONDING FILM

CROSS REFERENCE TO RELATED APPLICATIONS

This application is a 35 U.S.C. §371 National Phase Entry Application from PCT/KR2014/012981, filed Dec. 29, 2014, and designating the United States, which claims priority under 35 U.S.C. §119 to Korean Patent Application No. 10-2014-0000912 filed on Jan. 3, 2014 and to Korean Patent Application No. 10-2014-0190448 filed on Dec. 26, 2014, which are incorporated herein by reference in their entireties.

TECHNICAL FIELD

The present invention relates to a dicing film and a dicing die-bonding film, and more specifically, to a dicing film capable of improving a pick-up ability and preventing damage of a thin semiconductor chip in a dicing process of a semiconductor packaging process, a dicing die-bonding film including the dicing film, and a dicing method of a semiconductor wafer using the dicing die-bonding film.

BACKGROUND OF THE INVENTION

In general, a process of manufacturing a semiconductor chip includes a process of forming fine patterns on a wafer and a process of polishing the wafer and packaging the polished wafer so as to meet standards of a final apparatus. The packaging process includes: a wafer inspection process which inspects for defects of the semiconductor chip; a dicing process which cuts the wafer to make separated individual chips; a die-bonding process which attaches the separated chips to a mounting plate of a circuit film or a lead frame; a wire bonding process which connects a chip pad provided on the semiconductor chip and circuit patterns of the circuit film or the lead frame via an electrical connector such as a wire; a molding process which encloses an outer portion with an encapsulant so as to protect inner circuits of the semiconductor chip and other components; a trim process which cuts a dambar connecting leads; a forming process which bends the leads to have a desired shape; a finished product inspection process which inspects defects of a finished package; and the like.

Through the dicing process, individual chips which are separated from each other are manufactured from the semiconductor wafer in which a plurality of chips are formed. In a broad sense, the dicing process is a process of grinding a rear surface of the semiconductor wafer and cutting the semiconductor wafer along dicing lines among the chips to manufacture the plurality of individual chips which are separated from each other.

Meanwhile, according to miniaturization of electronic devices and an increase in memory capacity, recently, a multi-chip package technology in which semiconductor chips are vertically stacked has been largely used, and individual chips need to have thin thickness in order to stack many chips.

According to the thin semiconductor wafer as described above, when excessive power is applied at the time of separating an adhesive layer and a cohesive layer, there are problems in that the thin chip may be damaged, such that a pick-up ability in the dicing process may be deteriorated.

DETAILED DESCRIPTION OF THE INVENTION

Technical Objectives

The present invention has been made in an effort to provide a dicing film capable of improving a pick-up ability and preventing damage of a thin semiconductor chip in a dicing process of a semiconductor packaging process, a dicing die-bonding film including the dicing film, and a dicing method of a semiconductor wafer using the dicing die-bonding film.

Technical Solutions

An exemplary embodiment of the present invention provides a dicing film including: a substrate film; and a cohesive layer, wherein a storage modulus of the cohesive layer at 30° C. is $3.0*10^5$ to $4.0*10^6$ Pa, and the cohesive layer has a degree of cross-linking of 80% to 99%.

A storage modulus of the cohesive layer at 80° C. may be $1.0*10^5$ Pa or more, or $1.0*10^5$ Pa to $4.0*10^5$ Pa.

The cohesive layer may include a cohesive resin, a photoinitiator, and a cross-linking agent.

The cohesive resin may include a (meth)acrylate-based resin having a glass transition temperature of −28° C. to −58° C. In the present specification, (meth)acrylate may include both of acrylate and methacrylate.

The cross-linking agent may include at least one compound selected from the group consisting of an isocyanate-based compound, an aziridine-based compound, an epoxy-based compound, and a metal chelate-based compound.

The cohesive layer may include 0.1 to 20 parts by weight of the photoinitiator and 0.1 to 40 parts by weight of the cross-linking agent based on 100 parts by weight of the cohesive resin.

The substrate film may be a polymer film selected from the group consisting of a polyolefin film, a polyester film, a polycarbonate film, a polyvinyl chloride film, a polytetrafluoroethylene film, a polybutene film, a polybutadiene film, a vinyl chloride copolymer film, an ethylene-vinyl acetate copolymer film, an ethylene-propylene copolymer film, and an ethylene-alkylacrylate copolymer film.

The substrate film may have a thickness of 10 μm to 200 μm, and the cohesive layer may have a thickness of 5 μm to 100 μm.

Another exemplary embodiment of the present invention provides a dicing die-bonding film including: the dicing film as described above; and an adhesive layer formed on at least one surface of the dicing film.

The adhesive layer may include a thermoplastic resin, an epoxy resin, and a curing agent.

The thermoplastic resin may include at least one polymer resin selected from the group consisting of polyimide, polyether imide, polyester imide, polyamide, polyether sulfone, polyether ketone, polyolefin, polyvinyl chloride, phenoxy, reactive butadiene acrylonitrile copolymer rubber, and (meth)acrylate-based resins.

The curing agent may include at least one compound selected from the group consisting of a phenolic resin, an amine-based curing agent, and an acid anhydride-based curing agent.

The adhesive layer may include 10 to 1000 parts by weight of the thermoplastic resin and 10 to 700 parts by weight of the curing agent based on 100 parts by weight of the epoxy resin.

The adhesive layer may further include at least one curing catalyst selected from the group consisting of phosphorus-based compound, a boron-based compound, a phosphorus-boron-based compound, and an imidazole-based compound.

The adhesive layer may have a thickness of 1 μm to 300 μm.

In addition, another exemplary embodiment of the present invention provides a dicing method of a semiconductor wafer, including: partially pre-treating the semiconductor wafer including the dicing die-bonding film as described above and a wafer stacked on at least one surface of the dicing die-bonding film so that the semiconductor wafer is completely divided or is dividable; and irradiating ultraviolet rays on a substrate film of the pre-treated semiconductor wafer and picking up individual chips separated by the division of the semiconductor wafer.

Advantageous Effect of the Invention

According to the present invention, a dicing film capable of improving a pick-up ability and preventing damage of a thin semiconductor chip in a dicing process of a semiconductor packaging process, a dicing die-bonding film including the dicing film, and a dicing method of a semiconductor wafer using the dicing die-bonding film are provided.

As the semiconductor wafer has a thin thickness, when excessive power is applied at the time of separating an adhesive layer and a cohesive layer, the thin chip may be damaged and the pick-up ability may be deteriorated. However, according to the dicing film, the dicing die-bonding film, and the dicing method of the semiconductor wafer, the pick-up ability may be improved, such that a pick-up process may be smoothly performed, and damage of the thin semiconductor chip may be prevented.

DETAILED DESCRIPTION OF THE EMBODIMENTS

Hereinafter, a dicing film, a dicing die-bonding film, and a dicing method of a semiconductor wafer according to exemplary embodiments of the present invention will be described in more detail.

According to an exemplary embodiment of the present invention, there is provided a dicing film including: a substrate film; and a cohesive layer, wherein a storage modulus of the cohesive layer at 30° C. is $3*10^5$ to $4*10^6$ Pa, and the cohesive layer has a degree of cross-linking of 80% to 99%.

The present inventors conducted research into a method of improving a pick-up ability and preventing damage of a thin semiconductor chip, and confirmed through experiments that at the time of using a dicing film including the cohesive layer having a specific storage modulus and degree of cross-linking, the pick-up ability may be improved and damage of the thin semiconductor chip may be prevented in a dicing process of a semiconductor packaging process, then completed the present invention.

In the related art, a method of decreasing a cohesive force of the cohesive layer of the dicing film to increase the pick-up ability was attempted; however, there is a limitation in improving the pick-up ability simply by decreasing only the cohesive force of the cohesive layer, and rather, the pick-up ability may be deteriorated. Accordingly, the present inventors applied the above-described cohesive layer having the specific storage modulus and degree of cross-linking, thereby solving the problems.

As described above, a storage modulus of the cohesive layer at 30° C. may be $3*10^5$ to $4*10^6$ Pa. When the storage modulus of the cohesive layer at 30° C. is less than $3*10^5$ Pa, a large amount of power is needed at the time of separating the cohesive layer and the adhesive layer, and the thin semiconductor chip may be damaged in the dicing process. In addition, when the storage modulus of the cohesive layer at 30° C. is more than $4*10^6$ Pa, strength of the cohesive layer may be increased, such that the pick-up ability may be deteriorated.

In addition, a degree of cross-linking of the cohesive layer may be 80% to 99%, or 85% to 98%. When the degree of cross-linking of the cohesive layer is less than 80%, anchoring between a cohesive agent and an adhesive agent may be increased, such that power required for separating the cohesive agent and the adhesive agent may be increased, and therefore the pick-up ability of the semiconductor wafer may be deteriorated. In addition, when the degree of cross-linking of the cohesive layer is more than 99%, a cohesive force of the cohesive layer may be largely deteriorated, such that a chip flying phenomenon, and the like, may occur during the dicing process.

In addition, in order to increase the pick-up ability of the semiconductor wafer at the time of using the dicing film, the storage modulus of the cohesive layer at 30° C. may be $3*10^5$ to $4*10^6$ Pa, the storage modulus of the cohesive layer at 80° C. may be $1.0*10^5$ Pa or more, or $1.0*10^5$ Pa to $4.0*10^6$ Pa.

Specific composition of the cohesive layer is not significantly limited except for the above description, and for example, the cohesive layer may include a cohesive resin, a photoinitiator, and a cross-linking agent.

The cross-linking agent may include at least one compound selected from the group consisting of an isocyanate-based compound, an aziridine-based compound, an epoxy-based compound, and a metal chelate-based compound. The cohesive layer may include 0.1 to 40 parts by weight of the cross-linking agent based on 100 parts by weight of the cohesive resin. When the cross-linking agent has an excessively small content, cohesiveness of the cohesive layer may be insufficient, and when the cross-linking agent has an excessively large content, the cohesive force of the cohesive layer may not be sufficiently secured before photocuring, such that a chip flying phenomenon, and the like, may occur.

Specific examples of the photoinitiator are not limited, but may include photoinitiators which are generally known in the art. In addition, the cohesive layer may include 0.1 to 20 parts by weight of the photoinitiator based on 100 parts by weight of the cohesive resin.

Kinds of the substrate film are not specifically limited as long as it is a generally used substrate film, and for example, the substrate film may be one polymer film selected from the group consisting of a polyolefin film, a polyester film, a polycarbonate film, a polyvinyl chloride film, a polytetrafluoroethylene film, a polybutene film, a polybutadiene film, a vinyl chloride copolymer film, an ethylene-vinyl acetate copolymer film, an ethylene-propylene copolymer film, and an ethylene-alkylacrylate copolymer film.

The substrate film may have a thickness of 10 μm to 200 μm, and the cohesive layer may have a thickness of 5 μm to 100 μm.

Specifically, the cohesive resin may include a (meth)acrylate-based resin having a glass transition temperature of −28° C. to −58° C., or −30° C. to −55° C. In the present specification, (meth)acrylate may include both of acrylate and methacrylate.

For example, the (meth)acrylate-based resin may be a copolymer of a (meth)acrylic ester-based monomer and a crosslinkable functional group-containing monomer. Here, examples of the (meth)acrylic ester-based monomer may include alkyl(meth)acrylates, and more specifically, may include a C1 to C12 alkyl group monomer, that is, one of pentyl(meth)acrylate, n-butyl(meth)acrylate, ethyl(meth)acrylate, methyl(meth)acrylate, hexyl(meth)acrylate, n-octyl(meth)acrylate, isooctyl(meth)acrylate, 2-ethylhexyl(meth)acrylate, dodecyl(meth)acrylate, or decyl(meth)acrylate, or mixtures of two or more thereof.

Examples of the crosslinkable functional group-containing monomer may include a hydroxy group-containing monomer, a carboxyl group-containing monomer or a nitrogen-containing monomer, or mixtures of two or more thereof.

Examples of the hydroxy group-containing compound may include 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 2-hydroxyethylene glycol(meth)acrylate, 2-hydroxypropylene glycol(meth)acrylate, or the like.

Examples of the carboxyl group-containing compound may include (meth)acrylic acid, 2-(meth)acryloyloxy acetic acid, 3-(meth)acryloyloxy propyl acid, 4-(meth)acryloyloxy-butyric acid, acrylic acid dimer, itaconic acid, maleic acid, maleic anhydride, or the like.

Examples of the nitrogen-containing monomer may include (meth)acrylonitrile, N-vinyl pyrrolidone, N-vinyl caprolactam, or the like.

Vinyl acetate, styrene, acrylonitrile, or the like, may be further included in the (meth)acrylate-based resin in order to improve other functionalities such as compatibility and the like.

The cohesive layer may further include an ultraviolet-curable compound.

Kinds of the ultraviolet-curable compound are not specifically limited, but for example, may include a multifunctional compound having a weight average molecular weight of about 500 to 300,000 (ex. polyfunctional urethane acrylate, polyfunctional acrylate monomer or oligomer, and the like). A person skilled in the art may easily select appropriate compounds according to desired usages. The ultraviolet-curable compound may have a content of 1 to 400 parts by weight, preferably 5 to 200 parts by weight, based on 100 parts by weight of the above-described cohesive resin. When the content of the ultraviolet-curable compound is less than 1 part by weight, a decrease in the cohesive force after curing may not be sufficient, such that the pick-up ability may be deteriorated, and when the content of the ultraviolet-curable compound is more than 400 parts by weight, cohesiveness of the cohesive agent before ultraviolet radiation may be insufficient, or delamination with a release film and the like may not be easily achieved.

The ultraviolet-curable cohesive agent may be a compound in which a carbon-carbon double bond is bound to an end of a branched chain or a backbone of an acrylic copolymer as well as the additive ultraviolet-curing compound. That is, the (meth)acrylic copolymer may further include the ultraviolet-curable compound bound to the branched chain of the backbone including the (meth)acrylic ester-based monomer and the crosslinkable functional group-containing monomer.

Kinds of the ultraviolet-curable compound are not specifically limited as long as it has 1 to 5, preferably 1 or 2, photocurable functional groups (e.g. a ultraviolet-polymerizable carbon-carbon double bond) per molecule, and has a functional group capable of reacting with a crosslinkable functional group included in the backbone. Here, examples of the functional groups capable of reacting with the crosslinkable functional group of the backbone may include an isocyanate group, an epoxy group, or the like, but the present invention is not limited thereto.

Specific examples of the ultraviolet-curable compound including functional groups capable of reacting with the hydroxy group included in the backbone may include (meth)acryloyloxy isocyanate, (meth)acryloyloxy methyl isocyanate, 2-(meth)acryloyloxy ethyl isocyanate, 3-(meth)acryloyloxy propyl isocyanate, 4-(meth)acryloyloxy butyl isocyanate, m-propenyl-α,α-dimethylbenzyl isocyanate, methacryloyl isocyanate, or allyl isocyanate; an acryloyl monoisocyanate compound obtained by reaction of a diisocyanate compound or a polyisocyanate compound with (meth)acrylic acid 2-hydroxyethyl; an acryloyl monoisocyanate compound obtained by reaction of a diisocyanate compound or a polyisocyanate compound; a polyol compound and (meth)acrylic acid 2-hydroxyethyl; or specific examples of the ultraviolet-curable compound including functional groups capable of reacting with the carboxyl group included in the backbone may include one or more of glycidyl(meth)acrylate, allyl glycidyl ether, and the like, but the present invention is not limited thereto.

The crosslinkable functional groups included in the backbone of the ultraviolet-curable compound may be substituted in an amount of 5 mol % to 90 mol %, and may be included in the branched chain of a base resin. When the substitution amount is less than 5 mol %, a decrease in delamination force by ultraviolet irradiation may not be sufficient, and when the substitution amount is more than 90 mol %, cohesiveness of the cohesive agent before ultraviolet irradiation may be deteriorated.

The cohesive layer may appropriately include a tackifying agent such as a rosin resin, a terpene resin, a phenol resin, a styrene resin, an aliphatic petroleum resin, an aromatic petroleum resin, an aliphatic aromatic copolymer petroleum resin, or the like.

A method of forming the cohesive layer on the substrate film is not specifically limited, and for example, a method of directly applying a cohesive agent composition of the present invention onto the substrate film to form the cohesive layer, a method of applying the cohesive agent composition onto a delamination substrate to manufacture the cohesive layer and then transferring the cohesive layer on the substrate film using the delamination substrate, or the like, may be used.

A method of applying and drying the cohesive agent composition is not specifically limited, and for example, a method of applying a composition including each component itself or applying a composition including each component which is diluted in an appropriate organic solvent, by known methods such as a comma coater, a gravure coater, a die coater, a reverse coater, or the like, and then drying the solvent at a temperature of 60° C. to 200° C. for 10 seconds to 30 minutes, may be used. In addition, in this case, an aging process for sufficiently performing the crosslink reaction of the cohesive agent may be further performed.

Meanwhile, according to another exemplary embodiment of the present invention, a dicing die-bonding film including the dicing film and an adhesive layer formed on at least one surface of the dicing film are provided.

The adhesive layer may include a thermoplastic resin, an epoxy resin, and a curing agent.

The thermoplastic resin may include at least one polymer resin selected from the group consisting of polyimide, polyether imide, polyester imide, polyamide, polyether sulfone, polyether ketone, polyolefin, polyvinyl chloride, phenoxy, reactive butadiene acrylonitrile copolymer rubber, and (meth)acrylate-based resins.

The epoxy resin may include a general epoxy resin for an adhesive agent known in the art, and for example, an epoxy resin including two or more epoxy groups in one molecule and having a weight average molecular weight of 100 to 2000 may be used.

The epoxy resin may form a strong crosslink structure through a curing process to exhibit excellent adhesive property, thermal resistance, and mechanical strength. More specifically, the epoxy resin has preferably an average epoxy equivalent of 100 to 1000. When the epoxy equivalent of the epoxy resin is less than 100, the degree of cross-linking may be extremely increased, such that the adhesive film may be entirely hard, and when the epoxy equivalent of the epoxy resin is more than 1000, thermal resistance may be deteriorated.

Examples of the epoxy resin may include a bifunctional epoxy resin such as a bisphenol A epoxy resin, a bisphenol F epoxy resin, or the like; one or more of polyfunctional epoxy resins having 3 or more functional groups, such as a cresol novolac epoxy resin, a phenol novolac epoxy resin, a 4-functional epoxy resin, a biphenyl type of epoxy resin, a tri-phenol methane type of epoxy resin, an alkyl-modified triphenol methane type of epoxy resin, a naphthalene type of epoxy resin, a dicyclopentadiene type of epoxy resin, a dicyclopentadiene-modified phenol type of epoxy resin, or the like, but the present invention is not limited thereto.

In addition, the epoxy resin is preferably a mixed resin of a bifunctional epoxy resin and a multifunctional epoxy resin. The term: 「multifunctional epoxy resin」 used in the present specification means an epoxy resin having 3 or more functional groups. That is, the bifunctional epoxy resin generally has excellent flexibility, flowability at a high temperature, and the like, but decreased thermal resistance and curing speed. Meanwhile, the multifunctional epoxy resin having 3 or more functional groups has rapid curing speed and excellent thermal resistance due to high degree of cross-linking, but decreased flexibility and flowability. Therefore, by appropriately mixing and using two kinds of resins, elastic modulus and a tack characteristic of the adhesive layer may be controlled, and chip flying or burrs may be prevented in the dicing process.

A curing agent included in the adhesive layer is not specifically limited as long as it reacts with the epoxy resin and/or thermoplastic resin to form a crosslink structure, and for example, the curing agent may include at least one compound selected from the group consisting of a phenolic resin, an amine-based curing agent, and an acid anhydride-based curing agent.

The adhesive layer may include 10 to 1000 parts by weight of the thermoplastic resin and 10 to 700 parts by weight of the curing agent based on 100 parts by weight of the epoxy resin.

A curing catalyst serves to accelerate a function of the curing agent or curing of a resin composition for adhesion on the semiconductor, and curing catalysts known to be used in manufacturing a semiconductor adhesive film, and the like, may be used without specific limitation. For example, the curing catalyst may be at least one selected from the group consisting of phosphorus-based compound, a boron-based compound, a phosphorus-boron-based compound, and an imidazole-based compound. An amount of the curing catalyst used may be appropriately selected in consideration of physical properties and the like of the finally manufactured adhesive film, and for example, the curing catalyst may be used in an amount of 0.5 to 10 parts by weight based on 100 parts by weight of the epoxy resin, the (meth)acrylate-based resin, and the phenol resin.

In addition, the dicing die-bonding film may further include a release film formed on the adhesive layer. Examples of the release film which is usable may include one or more of plastic films such as a polyethylene terephthalate film, a polytetrafluoroethylene film, a polyethylene film, a polypropylene film, a polybutene film, a polybutadiene film, a vinyl chloride copolymer film, a polyimide film, or the like.

A surface of the release film described above may be release-treated with one or more of alkyd-based, silicone-based, fluorine-based, unsaturated ester-based, polyolefin-based, and wax-based materials, and particularly, among them, a releasing agent such as the alkyd-based, silicone-based, fluorine-based, materials, or the like, having thermal resistance is preferred.

The release film may generally have a thickness of about 5 μm to 500 μm, preferably about 10 μm to 200 μm, but the present invention is not limited thereto.

A method of manufacturing the dicing die-bonding film is not specifically limited, and for example, a method of sequentially forming a cohesive part, an adhesive part, and a release film on the substrate film, or a method of separately manufacturing the dicing film (the substrate film plus the cohesive part) and the die-bonding film or the release film having the adhesive part formed therein, and performing a lamination method, and the like, may be used.

The lamination method is not specifically limited, but a hot-roll laminate method or a laminate pressing method may be used, and among them, the hot-roll laminate method is preferred in view of a possibility of a continuous process and efficiency. The hot-roll laminate method may be performed at a temperature of 10° C. to 100° C. under a pressure of 0.1 kgf/cm$^2$ to 10 kgf/cm$^2$, but the present invention is not limited thereto.

According to another exemplary embodiment of the present invention, a dicing method of a semiconductor wafer is provided, including: partially pre-treating the semiconductor wafer including the dicing die-bonding film as described above and a wafer stacked on at least one surface of the dicing die-bonding film so that the semiconductor wafer is completely divided or is dividable; and irradiating ultraviolet rays on a substrate film of the pre-treated semiconductor wafer and picking up individual chips separated by the division of the semiconductor wafer.

In the present exemplary embodiment, all the above description regarding the dicing die-bonding film may be included.

In addition to the details of the dicing method described above, apparatuses, methods, and the like used in the dicing method of the semiconductor wafer which are generally known may be used without specific limitation.

As the dicing die-bonding film including the dicing film is used, the pick-up ability may be improved and the thin semiconductor chip may be prevented from being damaged in the dicing process of the semiconductor packaging process.

The specific embodiments of the invention will be described in more detail in the following examples. The following examples are provided only to illustrate the embodiments of the invention, and the scope of the invention is not limited to the following examples.

PREPARATION EXAMPLE: PREPARATION OF (METH)ACRYLATE-BASED RESIN

Preparation Example 1

A mixture consisting of 68.5 parts by weight of 2-ethylhexyl acrylate (2-EHA), 8.5 parts by weight of methyl acrylate (MA), and 23 parts by weight of hydroxyethyl acrylate (HEA) monomers were put into a reactor equipped with a cooling system so as to achieve reflux of a nitrogen gas and ease of temperature control according to compositions shown in Table 1 below.

Then, n-DDM at 400 ppm as a chain transfer agent (CTA) and 100 parts by weight of ethyl acetate (EAc) as a solvent based on 100 parts by weight of the monomer mixture were added thereto, and sufficiently mixed with each other at 30 r for 30 minutes or more while injecting nitrogen in order to remove oxygen from the reactor. Then, the temperature was increased and maintained at 62° C., V-60 (azobisisobutyronitrile) at 300 ppm as a reaction initiator was added thereto to thereby initiate the reaction, followed by polymerization for 6 hours, to prepare a primary reaction material.

24.6 parts by weight of 2-methacroyloxyethyl isocyanate (MOI) (80 mol % based on HEA in the primary reaction material) and 1 wt % of a catalyst (dibutyl tin dilaurate: DBTDL) based on MOI were mixed in the primary reaction material, followed by reaction at 40° C. for 24 hours, to prepare a (meth)acrylate-based polymer resin in which an ultraviolet curing group was introduced into a branched chain of the polymer in the primary reaction material (glass transition temperature: −38.2° C.).

Preparation Examples 2 to 5

(Meth)acrylate-based polymer resins were prepared by the same method as Preparation Example 1, except for the compositions shown in Table 1 below.

TABLE 1

| | | Preparation Example (Unit: g) | | | | | |
|---|---|---|---|---|---|---|---|
| | | 1 | 2 | 3 | 4 | 5 | 6 |
| Primary Reaction Material | 2-EHA | 68.5 | 60.6 | 86.5 | 85.0 | 92.0 | 48.0 |
| | MA | 8.5 | | | | | 15.2 |
| | EHMA | | 30.0 | | | | 9.8 |
| | HEA | 23.0 | 9.4 | 13.5 | 15.0 | 8.0 | 27.0 |
| Secondary Reaction Material | MOI | 24.6 | 10.0 | 15.3 | 15.0 | 10.2 | 25.3 |
| Glass Transition Temperature (° C.) | | −38.2 | −43.2 | −53.2 | −52.6 | −59.0 | −26.6 |

2-EHA: 2-ethy hexyl acrylate
MA: methyl acrylate
EHMA: 2-ethyl hexyl methacrylate
HEA: hydroxy ethyl acrylate
MOI: 2-methacroyloxyethyl isocyanate Preparation Example: Manufacture of Dicing Film, Die-Bonding Film, and Dicing Die-Bonding Film Example 1

(1) Manufacture of Die-Bonding Film

A composition consisting of 90 g of a high molecular weight acrylic resin (Tg 20° C., weight average molecular weight of 850,000) and 30 g of an epoxy resin (novolac epoxy resin, a softening point of 94° C.), 20 g of a phenol resin as a curing agent for the epoxy resin (phenol novolac resin, a softening point of 94° C.), 0.1 g of a medium temperature-initiation curing accelerator (2-methyl-imidazole), 0.5 g of a high temperature-initiation curing accelerator (2-phenyl-4-methyl imidazole), 20 g of a silica as a filler (an average particle diameter of 75 mm) and methyl ethyl ketone were stirred and mixed with each other.

The mixed composition was applied to a release-treated PET having a thickness of 38 um and dried at 110° C. for 3 minutes to manufacture a die-bonding film having a coating thickness of 20 um.

(2) Manufacture of Dicing Film 7 g of a TDI-based isocyanate curing agent and 3 g of a photoinitiator (Irgacure 184) were mixed with 100 g of (meth)acrylate-based polymer resin of Preparation Example 1 to prepare a cohesive agent composition.

The cohesive agent composition was applied to a release-treated PET having a thickness of 38 um and dried at 110° C. for 3 minutes to form a cohesive agent layer having a thickness of 10 um. The formed cohesive agent layer was laminated on a polyolefin substrate film having a thickness of 100 um, followed by aging, to manufacture a dicing film.

In addition, the cohesive agent layer formed on the release-treated PET having a thickness of 38 um was laminated on the same release-treated PET, followed by aging, to be used for measuring storage modulus of the cohesive agent.

(3) Manufacture of Dicing Die-Bonding Film

A die-bonding film which was cut in a circle was transferred on the manufactured dicing film by lamination under a condition of 5 kgf/cm$^2$ to manufacture a dicing die-bonding film.

Examples 2 to 5 and Comparative Examples 1 to 4

Dicing die-bonding films were manufactured by the same method as Example 1, except for using (meth)acrylate-based polymer resins shown in Table 2 below at the time of manufacturing the dicing films.

TABLE 2

|  | Example | | | | | Comparative Example | |
| --- | --- | --- | --- | --- | --- | --- | --- |
|  | 1 | 2 | 3 | 4 | 5 | 1 | 2 |
| (Meth)acrylate-based Polymer Resin 100 g | Preparation Example 1 | Preparation Example 2 | Preparation Example 3 | Preparation Example 4 | Preparation Example 3 | Preparation Example 5 | Preparation Example 6 |
| TDI Curing Agent [g] | 7 | 3 | 3 | 6 | 2 | 1 | 10 |
| Photoinitiator [g] | 3 | 3 | 3 | 3 | 3 | 3 | 3 |

Experimental Example

Physical properties of the dicing die-bonding films of the examples and comparative examples were evaluated by methods as described below, and results thereof were shown in Table 3 below.

Experimental Example 1: Storage Modulus of Cohesive Agent

As described in [Manufacture of Dicing Film] of the examples and comparative examples, each cohesive agent layer having a thickness of 10 um and formed on the release-treated PET film (a thickness of 38 um) was laminated on the release-treated PET film (a thickness of 38 um), followed by aging, and several sheets of the cohesive layers were stacked to manufacture a cohesive agent sample having a thickness of 1 mm.

The measurement sample having a thickness of 1 mm as manufactured above was cut in a rectangular shape (17 mm×5 mm), and storage modulus from 30° C. to 150° C. was measured under conditions of a frequency of 1 Hz, a pre-load force of 0.01 N, and a rising temperature rate of 10° C./min by using Dynamic Mechanical Analysis (DMA: TA instrument). Each storage modulus (Pa) of the cohesive agent measured at 30° C. and 80° C. is shown in Table 3 below.

Experimental Example 2: Degree of Cross-Linking of Cohesive Agent 0.5 g (a) of only the cohesive agent layer was taken from the samples obtained by laminating the cohesive agent layer having a thickness of 10 um formed on release-treated PET, followed by aging, and immersed in a solvent (200 g of ethyl acetate) for 1 day. Then, the solvent having the cohesive agent layer was filtered through a 200 mesh wire net (c) after a weight of the mesh wire net was measured, and dried at 80° C. for 1 hour, then a weight (b) of the solvent and the mesh wire net after drying was measured.

Next, degree of cross-linking was measured by the following equation and shown in Table 3 below.

Degree of cross-linking (%)=[(weight of cohesive agent and wire net after drying $b$−weight of wire net $c$)/(initial weight $a$)]×100

Experimental Example 3: Measurement of Cohesive Force

The dicing die-bonding films manufactured by examples and comparative examples were cut to have a width of 25 mm, and irradiated on a substrate surface of the dicing film by ultraviolet rays having an intensity of 300 mJ/cm$^2$ (illuminance of 70 mW/cm$^2$) to manufacture samples for measuring cohesive force.

From the prepared samples, power (gf/25 mm) required for delaminating the die-bonding films in a dicing process under conditions of an angle of 180 degrees and a speed of 300 mm/s at room temperature was measured, and results thereof are shown in Table 3 below.

Experimental Example 4: Pick-Up Ability

After the release films of the dicing die-bonding films manufactured by the examples and comparative examples were delaminated, die-bonding surfaces were mounted at 60° C. in a mirror wafer (8 inch, thickness of 80 um), and then a dicing process was performed under the following conditions so as to have a chip size of 10 mm×10 mm.

The substrate surfaces of the films after the dicing process were irradiated by ultraviolet rays having an intensity of 300 mJ/cm$^2$ (illuminance of 70 mW/cm$^2$) to manufacture samples for measuring pick-up ability.

The prepared samples were picked up under the following conditions by using SPA-400 (SHINKAWA) equipment, the success rate thereof was measured, and then results thereof were determined as shown in Table 3 below.

—Dicing Conditions—
Apparatus: DFD-650 (DISCO)
Blade Type: 27HEBB (DISCO)
Cutting Blade Height (cut depth): 80 um
Dicing Speed: 50 mm/s
Speed of Blade: 40,000 rpm
—Pick-Up Conditions—
Apparatus: SPA-400 (SHINKAWA)
Expending Height: 3 mm
Number of Needles: 10
Needle Plunge Height: 0.2 mm
Needle Plunge Speed: 10 mm/s

TABLE 3

|  |  | Example | | | | | Comparative Example | |
|---|---|---|---|---|---|---|---|---|
|  |  | 1 | 2 | 3 | 4 | 5 | 1 | 2 |
| Storage Modulus (Pa) of Cohesive Agent | 30° C. | $2.0 \times 10^6$ | $6.0 \times 10^5$ | $5.2 \times 10^5$ | $1.6 \times 10^6$ | $3.4 \times 10^5$ | $3.4 \times 10^5$ | $6.2 \times 10^6$ |
|  | 80° C. | $9.1 \times 10^5$ | $2.8 \times 10^5$ | $3.2 \times 10^5$ | $9.6 \times 10^5$ | $2.0 \times 10^5$ | $2.0 \times 10^5$ | $4.5 \times 10^6$ |
| Degree of cross-linking (%) of Cohesive Agent | | 96.4 | 94.8 | 94.7 | 96.1 | 86.8 | 70.7 | 99.5 |
| Cohesive Force (gf/25 mm) After UV | | 7.2 | 11.2 | 10.2 | 9.2 | 12.1 | 17.4 | 5.1 |
| Success Rate (%) of Pick-up | | 100 | 100 | 100 | 100 | 100 | 22 | 64 |

It is confirmed from Table 3 above that the cohesive layers of Examples 1 to 5 had a storage modulus at 30° C. of 3.0*10⁵ to 2.0*10⁶ Pa and a storage modulus at 80° C. of 1.0*10⁵ Pa or more, and a degree of cross-linking of 80% to 99%, and accordingly, at the time of separating the adhesive layer with the cohesive layer, the thin chip was not damaged and the pick-up ability was increased.

Meanwhile, it was confirmed that the cohesive layers of Comparative Examples 1 and 2 had excessively low degree of cross-linking of the cohesive agent (Comparative Example 1) and had excessively high storage modulus at 30° C. (Comparative Example 2), such that the success rate of pick-up was 70% or less.

What is claimed is:

1. A dicing film comprising: a substrate film; and a cohesive layer, wherein a storage modulus of the cohesive layer at 30° C. is 3*10⁵ to 4*10⁶ Pa, a storage modulus of the cohesive layer at 80° C. is 1.0*10⁵ Pa or more, and the cohesive layer has a degree of cross-linking of 80% to 99%.

2. The dicing film of claim 1, wherein the cohesive layer includes a cohesive resin, a photoinitiator, and a cross-linking agent.

3. The dicing film of claim 2, wherein the cohesive resin includes a (meth)acrylate-based resin having a glass transition temperature of −28° C. to −58° C.

4. The dicing film of claim 2, wherein the cross-linking agent includes at least one compound selected from the group consisting of an isocyanate-based compound, an aziridine-based compound, an epoxy-based compound, and a metal chelate-based compound.

5. The dicing film of claim 2, wherein the cohesive layer includes 0.1 to 20 parts by weight of the photoinitiator and 0.1 to 40 parts by weight of the cross-linking agent based on 100 parts by weight of the cohesive resin.

6. The dicing film of claim 1, wherein the substrate film is one polymer film selected from the group consisting of a polyolefin film, a polyester film, a polycarbonate film, a polyvinyl chloride film, a polytetrafluoroethylene film, a polybutene film, a polybutadiene film, a vinyl chloride copolymer film, an ethylene-vinyl acetate copolymer film, an ethylene-propylene copolymer film, and an ethylene-alkylacrylate copolymer film.

7. The dicing film of claim 1, wherein the substrate film has a thickness of 10 μm to 200 μm, and the cohesive layer has a thickness of 5 μm to 100 μm.

8. A dicing die-bonding film comprising:
a dicing film comprising a substrate film and a cohesive layer; and
an adhesive layer formed on at least one surface of the dicing film;
wherein a storage modulus of the cohesive layer at 30° C. is 3*10⁵ to 4*10⁶ Pa, a storage modulus of the cohesive layer at 80° C. is 1.0*10⁵ Pa or more, and the cohesive layer has a degree of cross-linking of 80% to 99%.

9. The dicing die-bonding film of claim 8, wherein the adhesive layer includes a thermoplastic resin, an epoxy resin, and a curing agent.

10. The dicing die-bonding film of claim 9, wherein the thermoplastic resin includes at least one polymer resin selected from the group consisting of polyimide, polyether imide, polyester imide, polyamide, polyether sulfone, polyether ketone, polyolefin, polyvinyl chloride, phenoxy, reactive butadiene acrylonitrile copolymer rubber, and (meth)acrylate-based resins.

11. The dicing die-bonding film of claim 9, wherein the curing agent includes at least one compound selected from the group consisting of a phenolic resin, an amine-based curing agent, and an acid anhydride-based curing agent.

12. The dicing die-bonding film of claim 9, wherein the adhesive layer includes 10 to 1000 parts by weight of the thermoplastic resin and 10 to 700 parts by weight of the curing agent based on 100 parts by weight of the epoxy resin.

13. The dicing die-bonding film of claim 9, wherein the adhesive layer further includes at least one curing catalyst selected from the group consisting of a phosphorus-based compound, a boron-based compound, a phosphorus-boron-based compound, and an imidazole-based compound.

14. The dicing die-bonding film of claim 8, wherein the adhesive layer has a thickness of 1 μm to 300 μm.

15. A dicing method of a semiconductor wafer comprising:
partially pre-treating the semiconductor wafer including (a) a dicing die-bonding film, comprising: (i) a dicing film, comprising: a substrate film, and a cohesive layer, wherein a storage modulus of the cohesive layer at 30° C. is 3*10⁵ to 4*10⁶ Pa, and the cohesive layer has a degree of cross-linking of 80% to 99%; and (ii) an adhesive layer formed on at least one surface of the dicing film; and (b) a wafer stacked on at least one surface of the dicing die-bonding film so that the semiconductor wafer is completely divided or is dividable; and
irradiating ultraviolet rays on a substrate film of the pre-treated semiconductor wafer and picking up individual chips separated by the division of the semiconductor wafer.

* * * * *